(12) United States Patent
Egerton

(10) Patent No.: US 11,679,400 B2
(45) Date of Patent: Jun. 20, 2023

(54) SERVO OPERATED SPRAY MACHINE AND METHOD FOR OPERATING

(71) Applicant: CROWN PACKAGING TECHNOLOGY, INC., Alsip, IL (US)

(72) Inventor: Daniel Egerton, Yorkshire (GB)

(73) Assignee: Crown Packaging Technology, Inc., Alsip, IL (US)

( * ) Notice: Subject to any disclaimer, the term of this patent is extended or adjusted under 35 U.S.C. 154(b) by 0 days.

(21) Appl. No.: 15/570,088

(22) PCT Filed: Apr. 6, 2016

(86) PCT No.: PCT/GB2016/050961
§ 371 (c)(1),
(2) Date: Oct. 27, 2017

(87) PCT Pub. No.: WO2016/174391
PCT Pub. Date: Nov. 3, 2016

(65) Prior Publication Data
US 2018/0133732 A1 May 17, 2018

(30) Foreign Application Priority Data
Apr. 28, 2015 (GB) .................................. 1507225

(51) Int. Cl.
*B05B 11/02* (2023.01)
*B05B 13/02* (2006.01)
(Continued)

(52) U.S. Cl.
CPC .......... *B05B 11/02* (2013.01); *B05B 13/0242* (2013.01); *B05B 13/0609* (2013.01); *B05B 13/0681* (2013.01); *H05K 13/0411* (2018.08)

(58) Field of Classification Search
CPC . H05K 13/0411; B05B 11/02; B05B 13/0242; B05B 13/0609; B05B 13/0681
(Continued)

(56) References Cited

U.S. PATENT DOCUMENTS 3,771,032 A * 11/1973 Hender ..................... B60L 7/12
318/8
7,784,319 B2 * 8/2010 Saville ............... B21D 51/2692
72/94
(Continued)

FOREIGN PATENT DOCUMENTS

DE    10 2009 032739 A1    1/2011
EP          2293881 A2    3/2011
(Continued)

*Primary Examiner* — Bickey Dhakal
*Assistant Examiner* — Zemenay T Truneh
(74) *Attorney, Agent, or Firm* — Condo Roccia Koptiw LLP

(57) ABSTRACT

A method of operating a plurality of machines. Each of the machines uses a servo motor and a motor drive coupled to the servo motor, and the motor drive incorporates a regenerative braking system. The method comprises synchronising the servo motors in order to achieve overlap of the acceleration phases of some machines with the deceleration phases of other machines and providing electrical power from the regenerative braking systems of machines in a deceleration phase to machines in an acceleration phase. A controller for a machine implementing the method, and a system comprising such a controller and a plurality of machines are also disclosed.

19 Claims, 4 Drawing Sheets

(51) Int. Cl.
  *B05B 13/06* (2006.01)
  *H05K 13/04* (2006.01)
(58) Field of Classification Search
  USPC .......................................................... 29/739
  See application file for complete search history.

(56) References Cited

U.S. PATENT DOCUMENTS

| | | | |
|---|---|---|---|
| 8,612,110 B2* | 12/2013 | Ogawa | B60L 9/00 |
| | | | 191/2 |
| 2010/0072940 A1 | 3/2010 | Iwashita et al. | |
| 2011/0258848 A1* | 10/2011 | Fujita | H05K 13/0411 |
| | | | 29/739 |
| 2012/0082788 A1* | 4/2012 | Bauvin | B05B 13/0681 |
| | | | 427/233 |

FOREIGN PATENT DOCUMENTS

| | | |
|---|---|---|
| JP | H05-250017 A | 9/1993 |
| JP | H08-300345 A | 11/1996 |
| JP | 2011-233634 A | 11/2011 |
| JP | 2012-040665 A | 3/2012 |
| WO | WO 2007/140576 A1 | 12/2007 |
| WO | WO 2009/143134 | 11/2009 |

* cited by examiner

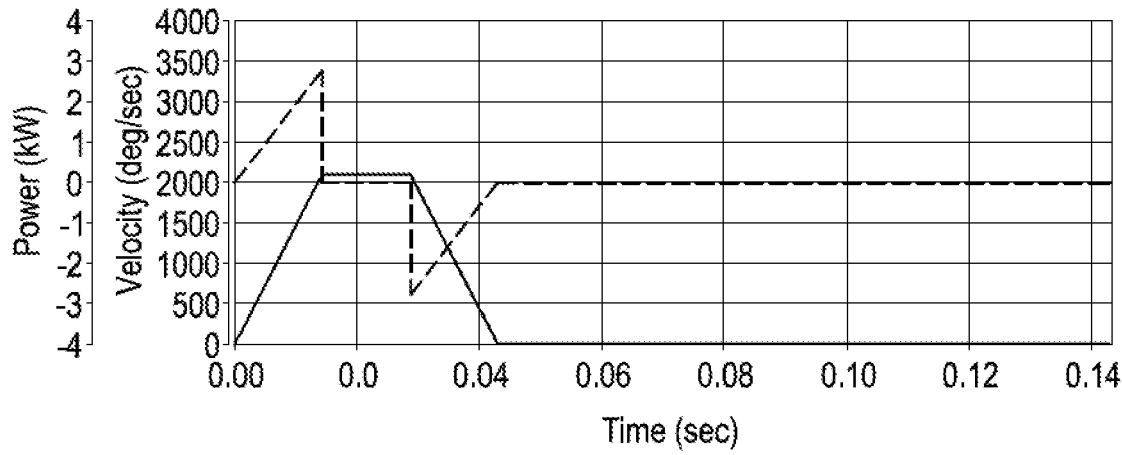

Figure 3

S101 Synchronising servo motors of each of a plurality of machines which uses a servo motor and a motor speed controller coupled to the servo motor, the motor speed controller incorporating a regenerative braking system, the synchronisation being in order to achieve overlap of the acceleration phases of some machines with the deceleration phases of other machines.

S102 Providing electrical power from the regenerative braking systems of machines in a deceleration phase to machines in an acceleration phase.

Figure 4

SERVO OPERATED SPRAY MACHINE AND METHOD FOR OPERATING

CROSS-REFERENCE TO RELATED APPLICATIONS

This application is the National Stage of International Application No. PCT/GB2016/050961, filed Apr. 6, 2016, which claims the benefit of GB application number 1507225.9, filed Apr. 28, 2015, the disclosures of which are incorporated herein by reference in their entirety.

TECHNICAL FIELD

The invention relates to servo operated can internal spray machines. In particular, the invention relates to a method of operating the spray machines to improve energy efficiency, and a controller and spray machines for implementing the method.

BACKGROUND

During the manufacture of food or beverage cans, it is desirable to spray the whole or a part of the inside of the can with a lacquer to act as a barrier between the metallic can and the contents of the can. This is done by a spray machine in the can production line. Typically, such a machine will run at 300-400 cans per minute.

In an exemplary spray machine as shown in FIG. 1, the cans (1) are fed into the top of the machine by a trackwork (2), and securely attached to a "spinner pad" (3) using vacuum suction. The spinner pads (3) (usually 6 or 12 to a machine) are arranged around a central turret (4) which indexes (i.e. moves the cans to the processing area at the appropriate times). The spinner pad (3) causes the attached can (1) to rotate, e.g. at speeds of around 2200 rev/min.

Each index of the turret (4) moves a rotating can (1) in front of a spray gun (5), which is timed to dispense a lacquer for a set time period (typically 100 ms). The indexing mechanism must therefore provide a 'dwell' (i.e. a period of time where the can is rotating in place) corresponding to the period in which the lacquer is applied. In general, the indexing mechanism will provide an acceleration phase, a deceleration phase, and a dwell, with the acceleration and deceleration being sufficient to move the cans into the required position. There may also be a period between the acceleration and deceleration where the speed is constant. A spray machine will typically have two or three spray guns, which ensures coverage along the length of the can body.

After passing in front of the spray guns, the can is discharged from the machine, for example via a discharge turret which grips the can body, or out of the bottom of the machine via a further trackwork (6).

Most current spraying machines use a mechanical indexing box to rotate the turret. The mechanical indexing box comprises an internal cam which operates to rotate the turret with the desired acceleration profile. The dwell time is therefore a inversely proportional to the rotational speed of the turret, which means that in order to achieve a consistent dwell time the machine must be run at the same speed. In a production line where other machines are able to modulate their speed smoothly, the spray machine must be regularly stopped in order to match the flow of cans from the other machines. This can lead to blockages due to lacquer drying in the spray guns.

Recent machines incorporate a servo motor (7) in place of the mechanical indexing box in order to overcome these problems. As the speed of the servo motor can be directly and finely controlled, the dwell time may be maintained whilst still allowing the overall speed of the machine to be changed according to demand. This leads to a smoother flow of cans, and reduces the necessity to stop the machine and risk blocked nozzles. Such a servo-operated spray machine is disclosed in EP 2293881 B1.

SUMMARY

It is an object of the present invention to increase the energy efficiency of servo operated spray machines.

According to a first aspect of the present invention, there is provided a method of operating a plurality of machines. Each of the machines uses a servo motor and a motor speed controller coupled to the servo motor, and the motor speed controller incorporates a regenerative braking system. The method comprises synchronising the servo motors in order to achieve overlap of the acceleration phases of some machines with the deceleration phases of other machines and providing electrical power from the regenerative braking systems of machines in a deceleration phase to machines in an acceleration phase.

According to a second aspect, there is provided a controller configured to operate a plurality of machines. Each of the machines uses a servo motor and a motor speed controller coupled to the servo motor, and the motor speed controller incorporates a regenerative braking system, with electrical power being redistributed between machines. The controller is configured to synchronise the servo motors to achieve overlap of the acceleration phases of some machines with the deceleration phases of other machines.

According to a third aspect, there is provided a system comprising a controller according to the second aspect, and a plurality of machines each of which comprises a servo motor and a motor speed controller coupled to the servo motor, the motor speed controller incorporating a regenerative braking system, wherein the controller is configured to operate the machines.

Further embodiments are defined in the appended claims.

BRIEF DESCRIPTION OF THE DRAWINGS

FIG. 3 shows a typical velocity and energy profile for a servo operated spray machine;

FIG. 4 is a flowchart of a method according to an embodiment; and

DETAILED DESCRIPTION

Within a can manufacturing plant, there is a significant desire to reduce power usage, both to save costs and to be more environmentally friendly. Spray machines incorporating a servo motor ("servo operated spray machines") will typically undergo up to 420 acceleration and deceleration cycles a minute. When servo motors decelerate, an electrical current is generated. In known servo operated spray machines, this current is directed through a "braking resistor" and allowed to dissipate as heat. There are commercially available "regenerative braking systems" which convert the current generated by deceleration into usable power which can be used by other devices or stored for later use. However, power storage will generally involve losses, and requires further components to be provided, significantly reducing the potential savings from regenerating braking, and so these systems have not been considered for spray machines.

Spray machines are typically placed in banks, generally containing seven to ten spray machines, each of which operates independently. A new way of operating such a bank of spray machines is proposed herein to allow a bank of machines to make better use of power generated from regenerative braking. It is recognised that there is no need for the spray machines to operate in synchronisation with one another. It is therefore proposed to control the bank of machines in such a way that when one machine (A) in the bank is in a decelerating phase, another machine (B) in the bank is in an accelerating phase, and therefore the electricity generated by the machine (A) can be used to reduce the external mains electricity required to operate machine (B). Applying this to all of the machines in a bank of seven to ten machines would allow such an overlap to occur for most of the acceleration phases of the machines, significantly reducing power consumption.

Figure 1:
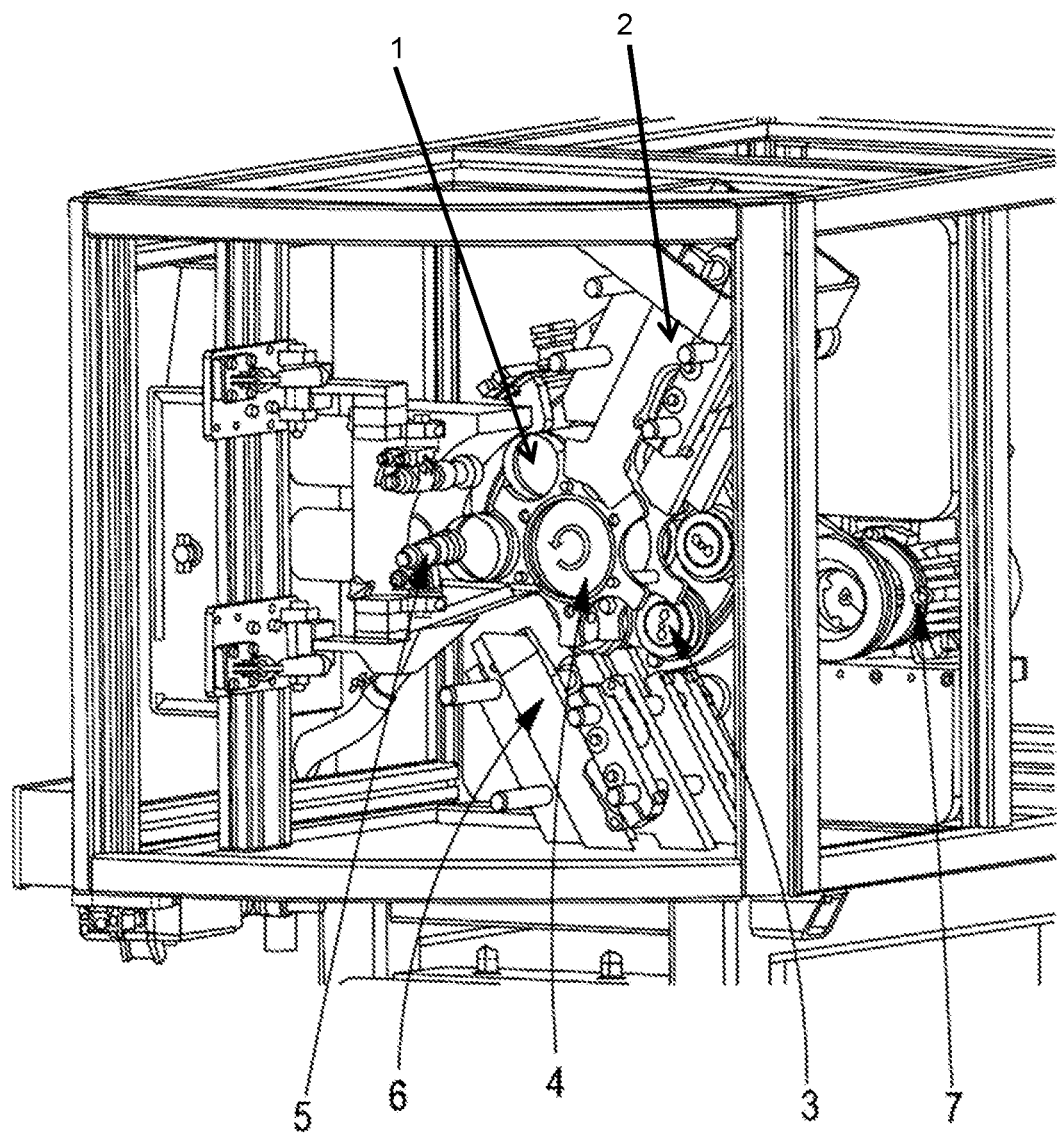
FIG. 1 is shows an exemplary servo operated spray machine.
Figure 2:
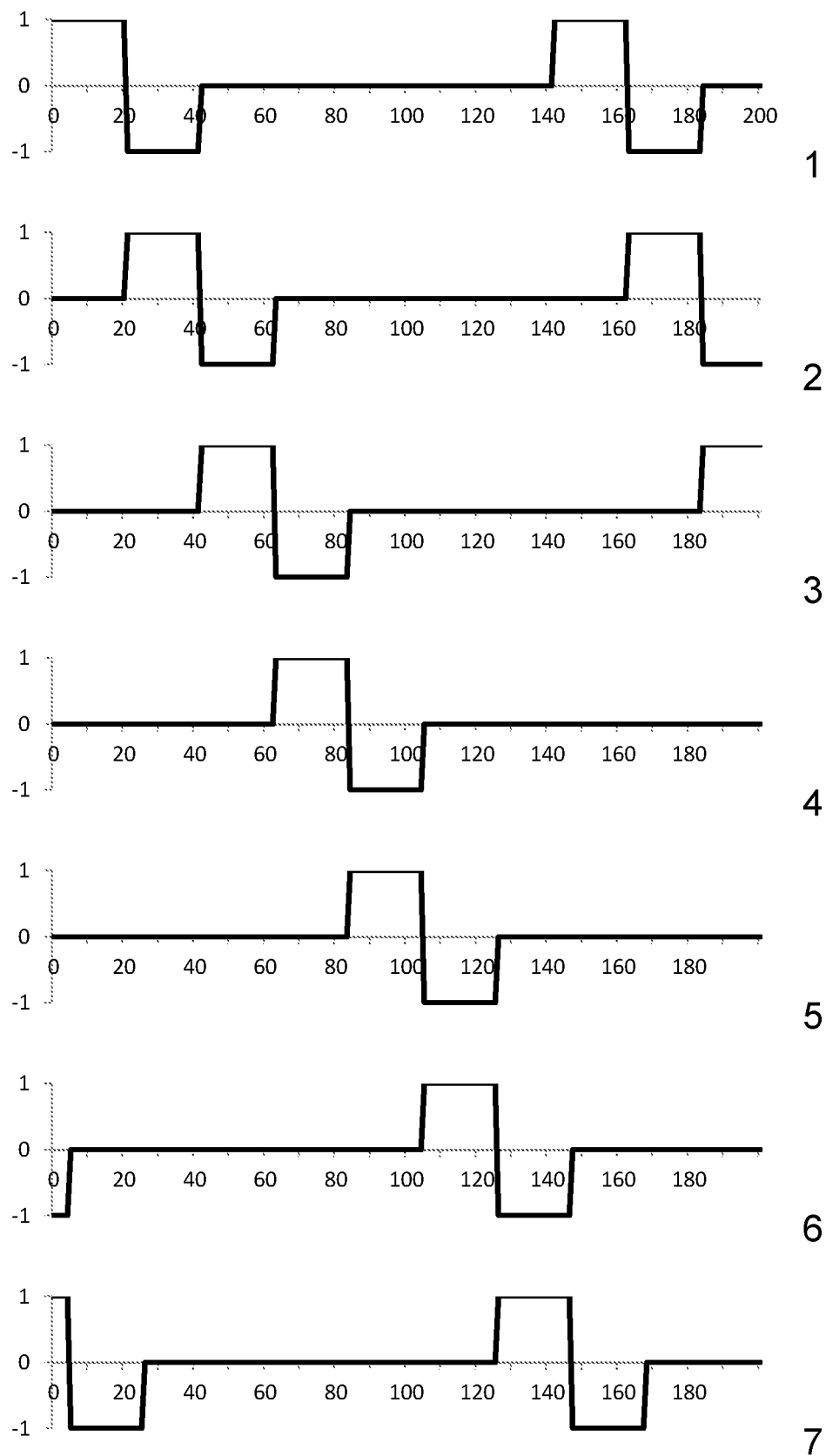
FIG. 2 shows acceleration profiles of each of a bank of servo operated spray machines according to an embodiment.

FIG. 2 illustrates a possible synchronisation scheme for seven machines running at 420 stops per minute, with each machine having a cycle labelled 1 to 7. 420 stops per minute gives a total cycle time of 1/7 of a second, approx. 143 ms, which means that each machine has a 100 ms dwell, a 21 ms acceleration phase, and a 21 ms deceleration phase. The acceleration phase is shown as +1 on each graph, the deceleration phase as −1, and the dwell as 0. As can be seen from the graphs, the acceleration and deceleration phases can be matched up so that each acceleration phase corresponds to the deceleration phase of the previous machine, i.e. the acceleration phase of machine 2 occurs simultaneously with the deceleration phase of machine 1. The synchronisation is not perfect, there is a short period at T=0 where both machines 1 and 7 are accelerating, and only machine 6 is decelerating, but it can be appreciated that there is always an accelerating machine to use the energy generated by a decelerating machine. This ensures that as much energy as possible is moved back into the system without the need for storage.

FIG. 2 relates to an idealised situation where each machine is operating at the same constant rate, the acceleration and deceleration phases are equal, and there is no period of constant velocity between the acceleration and deceleration phases. This may not be the case, the machines may operate at different rates, and the rate of each machine may change over time, e.g. due to changes in the rates of other machines in the production line. The acceleration and deceleration phases may be varied, provided the minimum dwell time and required stops per minute are achieved, and the motion of the cans is sufficient to move them into the required position. Typically, each machine in the bank will run at the same rate (though this rate may change frequently).

A typical velocity profile is shown in FIG. 3, with the red line representing velocity and the yellow line representing the power input/output of the servo motor. As will be appreciated, the power input during acceleration and output during deceleration are very similar. The required synchronisation may be achieved, for example, by starting the machines out of phase with each other, so that each machine begins its acceleration phase as the previous machine begins its deceleration phase.

The spray machines are typically fed power via a DC voltage bus, with one bus for each spray machine. To enable power to be transferred between the machines easily, it is proposed that all of the spray machines in a bank be connected to the same DC voltage bus, and that the regenerative braking systems feed power into this bus during the deceleration phase.

While the above description relates to the example of servo operated can internal spray machines, the skilled person will appreciate that a similar principle can be applied to other machines which operate with an acceleration phase and a deceleration phase. A flowchart for the generic method is shown in FIG. 4. The machines use a servo motor and a motor speed controller coupled to the servo motor, the motor speed controller incorporating a regenerative braking system, and the servo motors are synchronised in order to achieve overlap of the acceleration phases of some of the machines with the deceleration phases of the other machines S101. Electrical power is provided from the regenerative braking systems of machines in a deceleration phase to machines in an acceleration phase S102.

The servo motors may be synchronised in order to maximise total overlap between acceleration and deceleration phases of the machines. Of course, this method only applies where there are multiple machines present. This allows the savings of regenerative braking to be maximised, as there are no losses relating to the need to store the energy between a deceleration phase and an acceleration phase.

Figure 5:
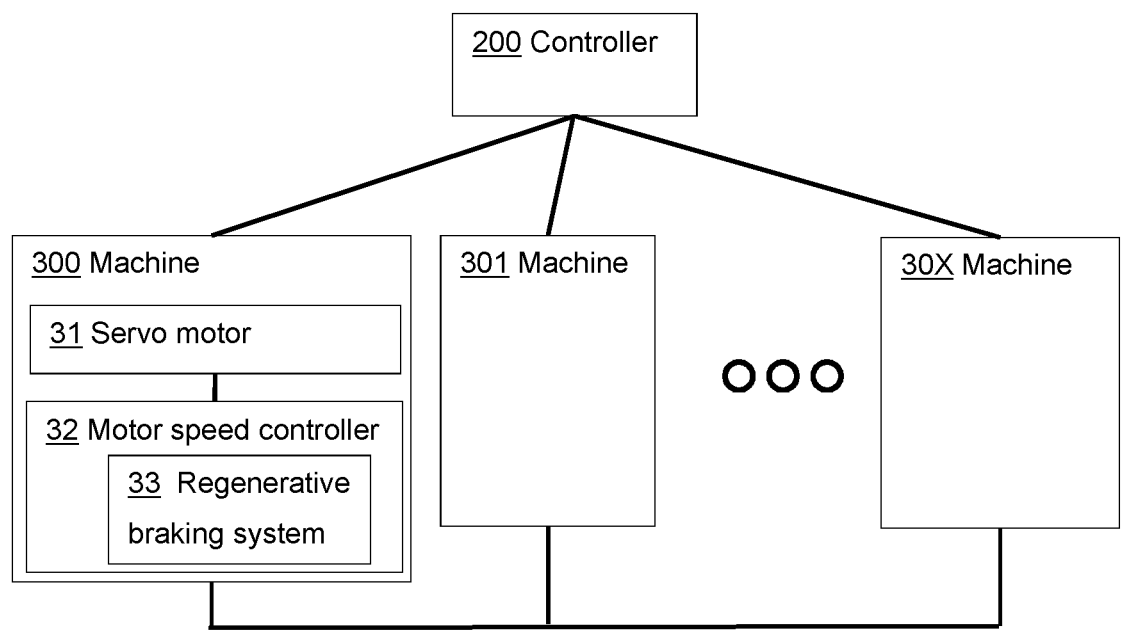
FIG. 5 is a schematic diagram of system according to an embodiment.

FIG. 5 is a schematic diagram of system 100. The system comprises a controller 200 and a plurality of spray machines 300, 301, 30X. Each machine comprises a servo motor 31 and a motor speed controller 32 coupled to the servo motor, the motor speed controller incorporating a regenerative braking system 33 (shown in machine 300), and the machines are connected in order to allow power to be redistributed between the machines.

The controller may be a single unit, which is connected to each machine, as shown in FIG. 5. Alternatively, the controller may be implemented as a distributed unit, with processors in each of the machines cooperating in order to act as the controller.

Although the invention has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

The invention claimed is:

1. A controller configured to operate a plurality of can internal spray machines each machine using a servo motor and a motor speed controller coupled to the servo motor, each servo motor being configured to rotate a respective turret of one of the plurality of can internal spray machines, the motor speed controller incorporating a regenerative braking system, the controller being adapted to synchronise the servo motors to achieve overlap of acceleration phases of some of the can internal spray machines with deceleration phases of other can internal spray machines, whereby the synchronizing the servo motors enables the regenerative braking systems to redistribute electrical power between the can internal spray machines, wherein the controller is adapted to control rotation rate of a first turret of a first can internal spray machine of the plurality of can internal spray machines and to control rotation rate of a second turret of a second can internal spray machine of the plurality of can internal spray machines to achieve a first rate of stops per minute of each one of the first and second can internal spray machines, and wherein the controller is further adapted to control, subsequent to the first and second can internal spray machines achieving the first rate of stops per minute and in response to a change rates of other can internal spray machines in a production line of the system, the turrets of the first and the second can internal spray machines to operate at a second rate of stops per minute that different than the first rate of stops per minute.

2. The controller according to claim 1, wherein the can internal spray machines each comprise an indexing mechanism, the indexing mechanism comprising the servo motor.

3. The controller according to claim 1, the controller being either a central controller or controller distributed across the machines.

4. The controller according to claim 1, wherein each one of the plurality of can internal spray machines is configured to rotate a can to a processing area independently of the rotation of each of the other plurality of can internal spray machines such that each can is rotated by a single one of the plurality of can internal spray machines.

5. The controller according to claim 1, wherein the controller is further configured to operate the plurality of can internal spray machines to undergo up to 420 acceleration and deceleration cycles per minute.

6. The controller according to claim 1, wherein each servo motor of each can internal spray machine is individually controlled by their respective motor speed controller.

7. The controller according to claim 1, wherein the controller is further adapted to synchronize the servo motors to achieve overlap of acceleration phases of multiple of the plurality of the can internal spray machines with a deceleration phase of a single one of the can internal spray machines.

8. The controller according to claim 1, the controller is adapted to control the first can internal spray machine to achieve the second rate of stops per minute and to control the second can internal spray machine to achieve the second rate of stops per minute in response to a change in a rate of stops per minute achieved by other can internal spray machines of the plurality of can internal spray machines.

9. The controller according to claim 1, wherein the first and second rates of rotation are substantially constant over time.

10. A system for spraying can bodies with lacquer, the system comprising:
a plurality of can internal spray machines, each one of the can internal spray machines including:
a rotatable turret adapted for indexing the can bodies into position relative to one or more spray guns during a dwell period between an acceleration phase and a deceleration phase;
a servo motor and a motor speed controller coupled to the servo motor, each servo motor being configured to rotate a respective one of the turrets; and,
the motor speed controller adapted for incorporating a regenerative braking system; and
a controller configured to operate the can internal spray machines, the controller being adapted to synchronise the servo motors to achieve overlap of the acceleration phases of some of the can internal spray machines with the deceleration phases of other of the can internal spray machines, whereby the synchronizing the servo motors enables the regenerative braking systems to redistribute electrical power between or among the can internal spray machines, wherein the controller is further adapted to control a first can internal spray machine of the plurality of can internal spray machines to operate a first turret of the first can internal spray machine at a first rate of stops per minute and to control a second can internal spray machine of the plurality of can internal spray machines to operate a second turret of the second can internal spray machine at the first rate of stops per minute, and wherein the controller is further adapted to control, subsequent to the turrets of the first and second can internal spray machines achieving the first rate of stops per minute, the turrets of the first and second can internal spray machines to operate at a second rate of stops per minute in response to a change rates of other can internal spray machines in a production line of the system; and wherein the controller is adapted to maintain a minimum dwell period in each of the first rate of stops per minute and the second rate of stops per minute.

11. The system of claim 10, wherein the can internal spray machines each comprise an indexing mechanism, the indexing mechanism comprising the servo motor.

12. The system of claim 10, wherein the controller is either a central controller or controller distributed across the machines.

13. The system of claim 10, wherein the controller is further configured to operate the plurality of can internal spray machines to undergo up to 420 acceleration and deceleration cycles per minute.

14. A method of operating a plurality of can internal spray machines, each one of the can internal spray machines having a servo motor for operating a can turret and a motor speed controller coupled to the servo motor, each servo motor being configured to rotate a respective one of the turrets of the plurality of can internal spray machines, the method comprising:
(a) accelerating each one of the servo motors such that each servo motor has an acceleration phase,
(b) decelerating each one of the servo motors such that each servo motor has a deceleration phase;
(c) synchronising the acceleration (a) and deceleration (b) of the servo motors in order to achieve overlap of the acceleration phases of some of the can internal spray machines with the deceleration phases of other of the can internal spray machines;
(d) subsequent to turrets of first and second can internal spray machines of the plurality of the can internal spray machines achieving a first rate of stops per minute, controlling the first and second can internal spray machines to operate at a second rate of stops per minute in response to a change rates of other can internal spray machines in a production line of the system, wherein the second rate of stops per minute is different than the first rate of stops per minute; and
(e) providing electrical power from regenerative braking systems of the can internal spray machines in a deceleration phase to the can internal spray machines in an acceleration phase.

15. The method of claim 14 further comprising the step of, after the decelerating step, pausing the servo motors for a dwell period.

16. The method of claim 14 wherein the providing step is performed without energy storage.

17. The method according to claim 14, wherein each one of the can internal spray machines comprise an indexing mechanism, the indexing mechanism comprising the servo motor.

18. The method according to claim 14, wherein the step of synchronising (c) comprises synchronising the servo motors in order to achieve optimal overlap between acceleration and deceleration phases of the machines and thereby achieve substantially maximum energy transfer from decelerating to accelerating machines.

19. The method of claim 14, wherein the accelerating and decelerating steps occur in cycles of up to 420 cycles per minute.

* * * * *